United States Patent
Hirano

(10) Patent No.: US 8,193,097 B2
(45) Date of Patent: Jun. 5, 2012

(54) PLASMA PROCESSING APPARATUS AND IMPEDANCE ADJUSTMENT METHOD

(75) Inventor: Taichi Hirano, Nirasaki (JP)

(73) Assignee: Tokyo Electron Limited, Tokyo (JP)

(*) Notice: Subject to any disclaimer, the term of this patent is extended or adjusted under 35 U.S.C. 154(b) by 326 days.

(21) Appl. No.: 12/466,095

(22) Filed: May 14, 2009

(65) Prior Publication Data

US 2009/0223926 A1 Sep. 10, 2009

Related U.S. Application Data

(62) Division of application No. 11/142,391, filed on Jun. 2, 2005, now abandoned.

(60) Provisional application No. 60/589,809, filed on Jul. 22, 2004.

(30) Foreign Application Priority Data

Jun. 2, 2004 (JP) .................................. 2004-165074

(51) Int. Cl.
*H01L 21/302* (2006.01)

(52) U.S. Cl. ...................... 438/710; 216/67; 315/111.21; 333/32; 313/231.31; 156/345.43; 156/345.44; 156/345.47; 118/723 R; 118/723 E

(58) Field of Classification Search ............. 156/345.43, 156/345.44, 345.47; 118/723 R, 723 E; 333/32; 313/231.31

See application file for complete search history.

(56) References Cited

U.S. PATENT DOCUMENTS

| 6,239,403 B1 * | 5/2001 | Dible et al. .............. 219/121.43 |
| 6,239,406 B1 | 5/2001 | Onoma et al. |
| 6,423,242 B1 | 7/2002 | Kojima et al. |
| 2001/0037770 A1 * | 11/2001 | Otsubo ................... 118/723.001 |
| 2004/0035365 A1 * | 2/2004 | Yamazawa et al. ........ 118/723 E |

FOREIGN PATENT DOCUMENTS

| JP | 10-321598 | 12/1998 |
| JP | 2002-124400 | 4/2002 |
| JP | 2003-282542 | 10/2003 |
| JP | 2004-96066 | 3/2004 |

OTHER PUBLICATIONS

Japanese Office Action dated Jun. 15, 2010 and its English translation.

Taiwanese Office Action issued Oct. 25, 2011, in Patent Application No. 094118229 (with English-language translation).

* cited by examiner

*Primary Examiner* — Lan Vinh
*Assistant Examiner* — Jiong-Ping Lu
(74) *Attorney, Agent, or Firm* — Oblon, Spivak, McClelland, Maier & Neustadt, L.L.P.

(57) ABSTRACT

A plasma processing apparatus, for performing a plasma processing on a substrate to be processed by generating a plasma of the processing gas in an evacuable processing chamber, includes an impedance adjusting mechanism. The impedance adjusting mechanism is provided with a resonance circuit formed to allow a radio frequency current to flow into the first electrode; a variable impedance unit installed on a power feed line to the first electrode; a detector for detecting an apparatus state to be used to search a resonance point of the resonance circuit; and a controller for searching a resonance point of the resonance circuit by detecting a signal of the apparatus state of the detector while varying a value of the variable impedance unit in a state where the plasma is formed and then adjusting the value of the variable impedance unit at the resonance point to a reference value.

8 Claims, 12 Drawing Sheets

PLASMA PROCESSING APPARATUS AND IMPEDANCE ADJUSTMENT METHOD

CROSS-REFERENCE TO RELATED APPLICATIONS

The present application is a divisional application of and claims priority to U.S. application Ser. No. 11/142,391, filed Jun. 2, 2005, of which the entire content is hereby incorporated by reference, with the present application also claiming priority to predecessors of the '391 application as follows. U.S. application Ser. No. 11/142,391 claims priority to Japanese Application No. 2004-165074, filed Jun. 2, 2004 and U.S. Provisional Application No. 60/589,809, filed Jul. 22, 2004.

FIELD OF THE INVENTION

The present invention relates to a plasma processing apparatus for performing a plasma processing on a substrate such as a semiconductor substrate or the like and an impedance adjustment method employed in a plasma processing apparatus.

BACKGROUND OF THE INVENTION

For example, in a semiconductor device manufacturing process, a plasma processing such as an etching, a sputtering, a chemical vapor deposition (CVD) or the like is performed on a semiconductor wafer as a substrate to be processed.

As for a plasma processing apparatus for performing such plasma processing, there are used many different kinds of processing apparatuses and a capacitively coupled parallel flat type plasma apparatus is a typical one most commonly used among them.

In the capacitively coupled parallel flat type plasma processing apparatus, a pair of parallel flat electrodes (an upper and a lower electrode) is provided in a chamber, and a processing gas is introduced into the chamber. Further, a radio frequency electric field is formed between the electrodes by applying a radio frequency power to one of the electrodes to thereby form a plasma from the processing gas, which, in turn, can be used in performing a plasma processing on a semiconductor wafer.

To be specific, there has been a well known plasma processing apparatus for forming plasma by applying to an upper electrode a radio frequency power for generating plasma and then converting the plasma into an appropriate plasma state by applying to a lower electrode a radio frequency power for attracting ions. By employing such plasma processing apparatus for an etching process, a high reproducible etching process can be performed with a high selectivity (see, e.g., U.S. Pat. No. 6,423,242 B1).

In such a plasma processing apparatus, there is given rise on the side of a plasma source to a minor difference in the impedance between apparatuses or cleaning cycles due to dimensional tolerances or attachment errors of parts. However, the conventional plasma processing apparatus is not provided with a mechanism for solving the mechanical difference in impedance, so that process characteristics become different from one apparatus to another or from one cleaning cycle to another.

SUMMARY OF THE INVENTION

It is, therefore, a primary object of the present invention to provide a plasma processing apparatus capable of adjusting an impedance on the side of a plasma source and solving an impedance difference between apparatuses or cleaning cycles.

It is another object of the present invention to provide an impedance adjustment method in a plasma processing apparatus capable of simply adjusting an impedance.

In accordance with a first aspect of the invention, there is provided a plasma processing apparatus for performing a plasma processing on a substrate to be processed by generating a plasma of the processing gas in an evacuable processing chamber, the apparatus including: a first and a second electrode disposed to face each other in the processing chamber; a radio frequency power supply unit for supplying a radio frequency power for generating a plasma to the first electrode; a processing gas supply unit for supplying a processing gas into the processing chamber; and an impedance adjusting mechanism for adjusting an impedance on the side of a plasma source, wherein the impedance adjusting mechanism includes: a resonance circuit formed to allow a radio frequency current to flow into the first electrode; a variable impedance unit installed on a power feed line to the first electrode; a detector for detecting an apparatus state to be used to search a resonance point of the resonance circuit; and a controller for searching a resonance point of the resonance circuit by detecting a signal of the apparatus state of the detector while varying a value of the variable impedance unit in a state where the plasma is formed and then adjusting the value of the variable impedance unit at the resonance point to a reference value.

In accordance with a second aspect of the invention, there is provided a plasma processing apparatus for performing a plasma processing on a substrate to be processed by generating a plasma of the processing gas in an evacuable processing chamber, the apparatus including: a first and a second electrode disposed to face each other in the processing chamber, the first electrode being divided into an inner and an outer electrode; a radio frequency power supply unit for supplying a radio frequency power for generating a plasma to the first electrode; a processing gas supply unit for supplying a processing gas into the processing chamber; and an impedance adjusting mechanism for adjusting an impedance on the side of a plasma source, wherein the impedance adjusting mechanism includes: a resonance circuit formed to allow a radio frequency current to flow into the inner electrode of the first electrode; a variable impedance unit installed on a power feed line to the inner electrode or the outer electrode of the first electrode; a detector for detecting an apparatus state to be used to search a resonance point of the resonance circuit; and a controller for searching a resonance point of the resonance circuit by detecting a signal of the apparatus state of the detector while varying a value of the variable impedance unit in a state where the plasma is formed and then adjusting the value of the variable impedance unit at the resonance point to a reference value.

In accordance with a third aspect of the invention, there is provided a plasma processing apparatus for performing a plasma processing on a substrate to be processed by generating a plasma of the processing gas in an evacuable processing chamber, the apparatus including: a first and a second electrode disposed to face each other, the first electrode being divided into an inner and an outer electrode; a radio frequency power supply unit for supplying a radio frequency power for generating a plasma to the first electrode; a processing gas supply unit for supplying a processing gas into the processing chamber; and an impedance adjusting mechanism for adjusting an impedance on the side of a plasma source, wherein the impedance adjusting mechanism includes: a resonance circuit formed to allow a radio frequency current to flow into the inner electrode of the first electrode; a variable capacitor installed on a power feed line to the inner electrode of the first electrode; a detector for detecting an apparatus state to be used to search a resonance point of the resonance circuit; and a controller for searching a resonance point of the resonance circuit by detecting a signal of the apparatus state from the detector while varying a capacitance of the variable capacitor in a state where the plasma is formed and then adjusting a capacitance of the variable capacitor at the resonance point to a reference value.

In accordance with a fourth aspect of the invention, there is provided an impedance adjustment method in a plasma processing apparatus including an evacuable processing chamber accommodating therein a substrate to be processed; a first and a second electrode disposed to face each other in the processing chamber; and a radio frequency power supply unit for supplying a radio frequency power for generating a plasma to the first electrode; and a processing gas supply unit for supplying a processing gas to the processing chamber, in order to perform a plasma processing on the substrate to be processed by generating a plasma of the processing gas between the first and the second electrode, the method including the steps of: installing a variable impedance unit on a power feed line of the first electrode; installing a detector for detecting an apparatus state to be used to search a resonance point of a resonance circuit formed to allow a radio frequency current to flow into the first electrode; searching the resonance point of the resonance circuit by detecting a signal of the apparatus state with the detector while varying a value of the variable impedance unit in a state where the plasma is generated; and adjusting the value of the variable impedance unit at the resonance point to a reference value, thereby adjusting an impedance on the side of a plasma source.

In accordance with a fifth aspect of the invention, there is provided an impedance adjustment method in a plasma processing apparatus including an evacuable processing chamber accommodating therein a substrate to be processed; a first and a second electrode installed to face each other in the processing chamber, the first electrode being divided into an inner and an outer electrode; and a radio frequency power supply unit for supplying a plasma forming radio frequency power to the first electrode; and a processing gas supply unit for supplying a processing gas into the processing chamber, in order to perform a plasma processing on the substrate to be processed by generating a plasma of the processing gas between the first and the second electrode, the method including the steps of: installing a variable impedance unit on a power feed line to the inner or the outer electrode of the first electrode; installing a detector for detecting an apparatus state to be used to search a resonance point of a resonance circuit formed to allow a radio frequency current to flow into the inner electrode of the first electrode; searching the resonance point of the resonance circuit by detecting a signal of the apparatus state with the detector while varying a value of the variable impedance unit in a state where the plasma is generated; and adjusting the value of the variable impedance unit at the resonance point to a reference value, thereby adjusting an impedance on the side of a plasma source.

In accordance with a sixth aspect of the invention, there is provided an impedance adjustment method in a plasma processing apparatus including an evacuable processing chamber accommodating therein a substrate to be processed; a first and a second electrode installed to face each other in the processing chamber, the first electrode being divided into an inner and an outer electrode; and a radio frequency power supply unit for supplying a plasma forming radio frequency power to the first electrode; and a processing gas supply unit for supplying a processing gas into the processing chamber, in order to perform a plasma processing on the substrate to be processed by generating a plasma of the processing gas between the first and the second electrode, the method including the steps of: installing a variable capacitor on a power feed line to the inner electrode of the first electrode; installing a detector for detecting an apparatus state to be used to search a resonance point of a resonance circuit formed to allow a radio frequency current to flow into the inner electrode of the first electrode; searching the resonance point of the resonance circuit by detecting a signal of the apparatus state with the detector while varying a capacitance of the capacitor in a state where the plasma is generated; and adjusting a capacitance value of the variable capacitor at the resonance point to a reference value, thereby adjusting an impedance on the side of a plasma source.

In accordance with the present invention, there are provided a resonance circuit, a variable impedance unit installed on a power feed line of a first electrode and a detector for detecting an apparatus state to search a resonance point of the resonance circuit. In a state where plasma is generated, a signal of the apparatus state of the detector is detected while varying a value of the variable impedance unit, thereby searching a resonance point of the resonance circuit. Also, by adjusting an impedance on the side of the plasma source while setting a value of the variable impedance unit at the resonance point to a reference value, it is possible to minimize an impedance difference on the side of the plasma source between apparatuses or cleaning cycles due to dimensional tolerances or attachment errors of parts. Furthermore, since the adjustment can be performed in a state where the plasma is generated, a high impedance adjusting accuracy can be achieved. Moreover, since neither special measuring device nor a test device is used, it is advantageous in terms of cost. In addition, most of the adjustment can be automatically carried out and thus, there is no artificial mistake that can be made.

In the plasma processing apparatus of the present invention, the first electrode is divided into an inner electrode and an outer electrode, and a variable impedance unit is installed on a power feed line of the inner electrode or that of the outer electrode. In such plasma processing apparatus, a uniformity of a plasma spatial distribution can be improved by controlling an electric field of an inner and that of an outer portion on a plasma contact surface of the first electrode. Also, the impedance adjustment can be performed by using the variable impedance unit and the resonance circuit in which a radio frequency current flows in the inner electrode. Especially, by installing the variable capacitor on the power feed line of the inner electrode, the impedance adjustment can be carried out more effectively.

BRIEF DESCRIPTION OF THE DRAWINGS

The above and other objects and features of the present invention will become apparent from the following description of preferred embodiments, given in conjunction with the accompanying drawings, in which.

DETAILED DESCRIPTION OF THE PREFERRED EMBODIMENT

Hereinafter, preferred embodiments of the present invention will be described in detail with reference to the accompanying drawings.

Figure 1:
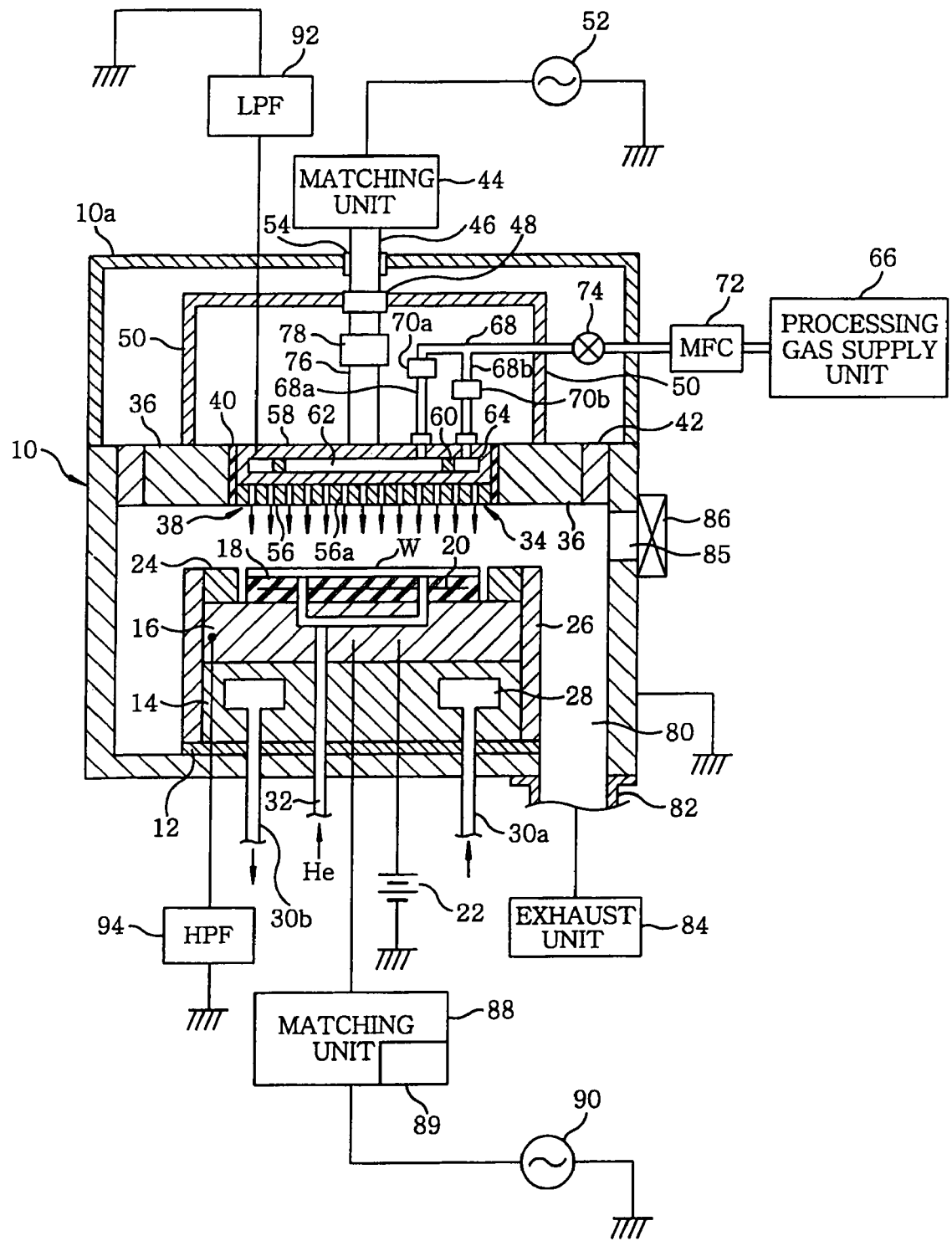
FIG. 1 is a schematic cross sectional view of a plasma etching apparatus in accordance with a preferred embodiment of the present invention.

FIG. 1 is a schematic cross sectional view of a plasma etching apparatus in accordance with a preferred embodiment of the present invention.

The plasma etching apparatus is a capacitively coupled parallel flat type plasma etching apparatus having an approximately cylindrical chamber (processing vessel) 10 made of aluminum whose surface is treated by an anodic oxidization. The chamber 10 is frame grounded.

A columnar susceptor support 14 is provided on a bottom of the chamber 10 via an insulating plate 12 made of ceramic or the like. Further, a susceptor 16 made of, e.g., aluminum is installed on the susceptor support 14. The susceptor 16 forms a lower electrode, and a semiconductor wafer W as a substrate to be processed is mounted thereon.

Provided on top of the susceptor 16 is an electrostatic chuck 18 for adsorptively holding the semiconductor wafer W with the help of an electrostatic force. The electrostatic chuck 18 has a structure in which an electrode 20 made of a conductive film is sandwiched between a pair of insulating layers or sheets, wherein a DC power supply is electrically connected to the electrode 20. Further, the semiconductor wafer W is adsorptively held on the electrostatic chuck 18 by the electrostatic force such as Coulomb force or the like generated by a DC voltage from the DC power supply 22.

Provided on a top surface of the susceptor 16 so as to surround the electrostatic chuck 18 is a focus ring 24 made of, e.g., silicon for improving an etching uniformity. A cylindrical inner wall member 26 made of, e.g., quartz is provided on lateral surfaces of the susceptor 16 and the susceptor support 14.

A coolant chamber 28 is circumferentially provided inside the susceptor support 14. A coolant, e.g., a cooling water, kept at a prescribed temperature is provided from a chiller unit (not shown) installed at an outside into the coolant chamber 28 through lines 30a and 30b to be circulated therein such that a processing temperature of the semiconductor wafer W on the susceptor can be controlled with the help of the coolant.

Moreover, a thermally conductive gas, e.g., He gas, is supplied from a thermally conductive gas supply unit to a space between the top surface of the electrostatic chuck 18 and a backside of the semiconductor wafer W through a gas supply line 32.

An upper electrode 34 is installed above the susceptor 16 serving as a lower electrode so as to face the susceptor 16 in parallel. Furthermore, a space between the upper and the lower electrode becomes a plasma generation region. The upper electrode 34 forms a facing surface, i.e., a surface being in contact with the plasma generation region while facing the semiconductor wafer W on the susceptor 16 serving as the lower electrode.

The upper electrode 34 includes an annular or a donut-shaped outer upper electrode 36 which faces the susceptor 16 and is separated therefrom at a prescribed distance; and a disc-shaped inner upper electrode 38 provided at a radially inner side of the outer upper electrode 36, the inner upper electrode 38 being insulated from the outer upper electrode 36. The outer and the inner upper electrode 36 and 38 perform a primary and a secondary function for a plasma generation, respectively.

Figure 2:
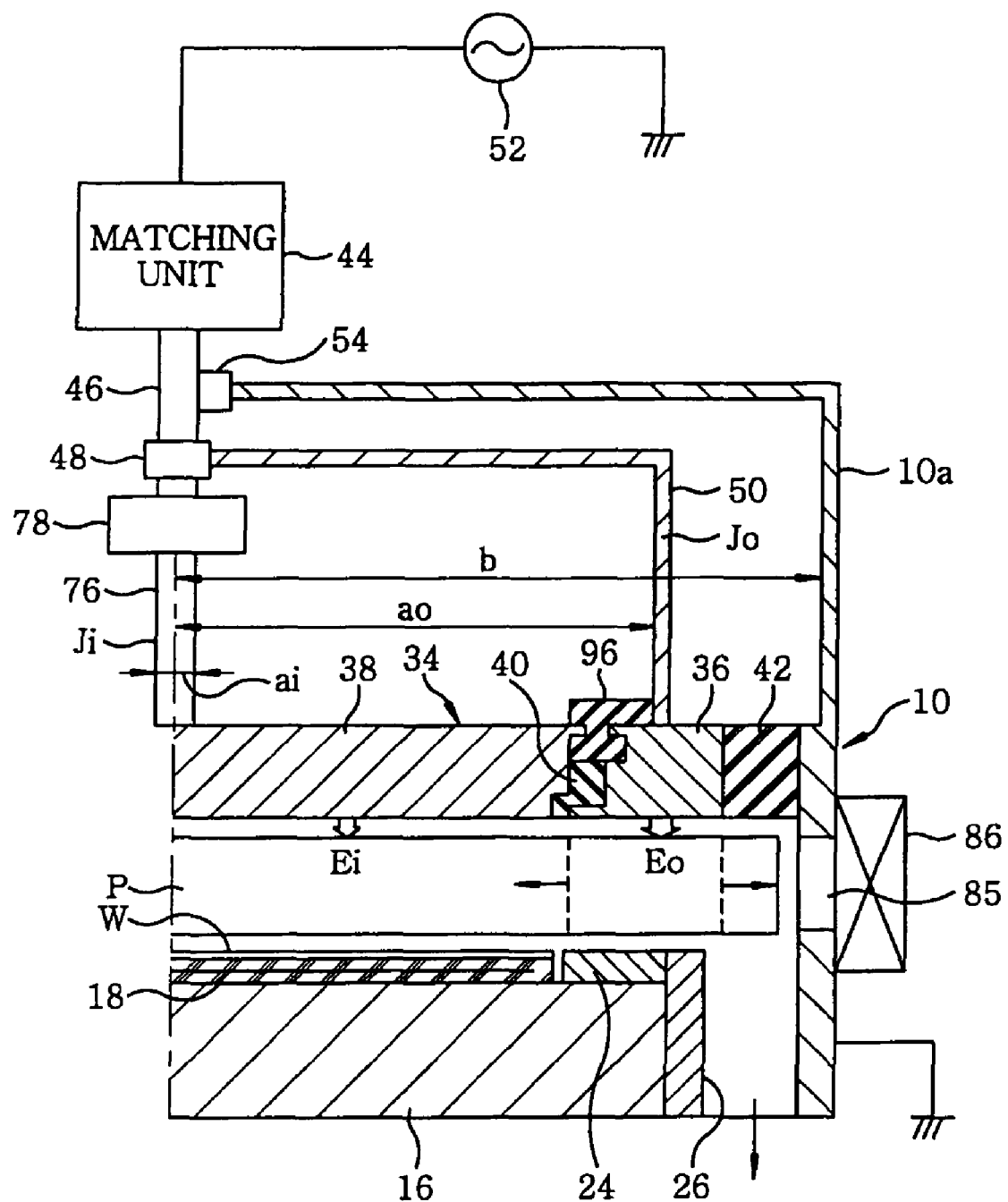
FIG. 2 shows an enlarged cross sectional view of a constitution of principal parts of the plasma etching apparatus of FIG. 1.

As illustrated in FIG. 2 showing enlarged principal parts of the plasma etching apparatus, an annular gap of about 0.25~2.0 mm is formed between the outer upper electrode 36 and the inner upper electrode 38. Furthermore, a dielectric material 40 made of, e.g., quartz, and a ceramic member 96 are provided in the gap. The ceramic member 96 may be omitted. A capacitor is formed between the electrodes 36 and 38 having the dielectric material 40 inbetween. A capacitance $C_{40}$ of the capacitor is selected or adjusted to be set at a desired value determined on the basis of a size of the gap and a dielectric constant of the dielectric material 40. Airtightly attached between the outer upper electrode 36 and a sidewall of the chamber 10 is an annular insulative shielding member 42 made of, e.g., alumina ($Al_2O_3$).

The outer upper electrode 36 is preferably made of a conductor or a semiconductor of a low resistance with low Joule heat, e.g., silicon. A first radio frequency supply 52 is electrically connected to the outer upper electrode 36 via a matching unit 44, an upper power feed rod 46, a connector 48 and a cylindrical power feeder 50. The first radio frequency power supply 52 outputs a radio frequency of 13.56 MHz or higher, e.g., 60 MHz. The matching unit 44 matches a load impedance to an internal (or an output) impedance of the first radio frequency power supply 52. When a plasma is generated in the chamber 10, the matching unit 44 serves to make the output impedance of the first radio frequency power supply 52 and the load impedance be seemingly matched to each other. An output terminal of the matching unit 44 is connected to a top portion of the upper power feed rod 46.

The cylindrical power feeder 50 is made of a conductive plate, e.g., an aluminum plate or a copper plate, of a cylindrical or conical shape or the like. A lower portion thereof is connected to the outer upper electrode 36 continuously along a circumferential direction, whereas an upper portion thereof is electrically connected to a lower portion of the upper power feed rod 46 by a connector 48. Outside the cylindrical power feeder 50, a sidewall of the chamber 10 upwardly extends to a position higher than the upper electrode 34 to form a cylindrical grounding conductor 10a. An upper portion of the cylindrical grounding conductor 10a is electrically insulated from the upper power feed rod 46 by a general insulation member 54. In such a configuration, a coaxial cable path having the cylindrical power feeder 50, the outer upper electrode 36 as a waveguide is formed by the cylindrical power feeder 50, the outer upper electrode 36 and the cylindrical grounding conductor 10a in a load circuit, viewed from the connector 48.

As illustrated in FIG. 1, the inner upper electrode 38 includes an electrode plate 56 having a plurality of gas discharge openings 56a, the electrode plate 56 being formed of a semiconductor material such as silicon, silicon carbide or the like; and an electrode support 58 formed of a conductive material, e.g., aluminum whose surface is treated by an anodic oxidization, for detachably supporting the electrode plate 56. Provided inside the electrode support 58 are a central gas introduction chamber 62 and a peripheral gas introduction chamber 64 partitioned by an annular partition member 60 formed of, e.g., an O-ring. A central shower head is formed by the central gas introduction chamber 62 and a plurality of gas discharge openings 56a provided in a bottom surface thereof, whereas a peripheral shower head is formed by the gas introduction chamber 64 and a plurality of gas discharge openings 56a provided in a bottom surface thereof.

A processing gas is supplied at a desired flow rate from a common processing gas supply source 66 into the two gas introduction chambers 62 and 64. In other words, a gas supply line 68 is divided into two branch lines 68a and 68b which are in turn connected to the gas introduction chambers 62 and 64, respectively, wherein branch lines 68a and 68b are provided with flow rate control valves 70a and 70b, respectively. Since a conductance of a flow path from the processing gas supply source 66 to the gas introduction chamber 62 and that to chamber 64 are substantially same, the flow rate of the processing gas supplied to the central and the peripheral gas introduction chamber 62 and 64 can be arbitrarily controlled by the flow rate control valves 70a and 70b. The gas supply line 64 is provided with a mass flow controller MFC 72 and an opening/closing valve 74. Likewise, by controlling the flow rate of the processing gas to be introduced into the central and the peripheral gas introduction chamber 62 and 64, it is possible to arbitrarily control a ratio of a flow rate Fc of a gas discharged through the central shower head to a flow rate Fe of a gas discharged through the peripheral shower head, i.e., Fc/Fe. Furthermore, it is also possible to vary the flow rates of the processing gases per unit area, the processing gases being respectively discharged through the central and the peripheral shower head. Furthermore, a type and a mixing ratio of the processing gases respectively discharged through the central and the peripheral shower head may be independently or separately selected.

Electrically connected to the electrode support 58 of the inner upper electrode 38 is the first radio frequency power supply 52 via the matching unit 44, the upper power feed rod 46, the connector 48 and the lower power feed rod 76. A variable capacitor 78 for variably controlling a capacitance is provided in the middle of the lower power feed rod 76. The variable capacitor 78, as will be described later, adjusts a balance between an inner and an outer electric field strength and also serves as a part of an impedance adjusting mechanism for adjusting an impedance of a plasma source of the apparatus.

Although it is not illustrated in the drawings, the outer and the inner upper electrode 36 and 38 are provided with an appropriate cooling chamber or cooling jacket and, further, respective temperatures of the electrodes can be controlled by a coolant from a chiller unit provided outside.

A gas exhaust port 80 is provided at a bottom of the chamber 10, and a gas exhaust unit 84 is connected to the gas exhaust port 80 via a gas exhaust line 82. The gas exhaust unit 84 can depressurize the inside of the chamber 10 to a desired vacuum level with a vacuum pump such as a turbo vacuum pump or the like. Moreover, a gate 85 for loading/unloading the semiconductor wafer W is provided at a sidewall of the chamber 10 and further can be opened/closed by a gate valve 86.

Electrically connected via a matching unit 88 to the susceptor 16 serving as a lower electrode is a second radio frequency power supply 90. By supplying a radio frequency power from the second radio frequency power supply 90 to the susceptor 16 serving as a lower electrode, ions are attracted to the semiconductor wafer W.

The second radio frequency power supply 90 outputs a radio frequency power ranging from 2 MHz to 27 MHz, e.g., 2 MHz. The matching unit 88 matches the load impedance to an internal (or output) impedance of the radio frequency power supply 90. When a plasma is generated in the chamber 10, the matching unit 88 makes the internal impedance of the radio frequency power supply 90 and the load impedance be seemingly matched to each other. In addition, the matching unit 88 accommodates therein a Vpp monitor 89 (voltage detector) forming a part of an impedance adjusting mechanism to be described later. Hereinafter, Vpp indicates a potential difference between peaks of a radio frequency voltage waveform.

Electrically connected to the inner upper electrode 38 is a low pass filter (LPF) 92 for passing the radio frequency (2 MHz) from the second radio frequency power supply 90 through the ground without passing the radio frequency (60 MHz) from the first radio frequency power supply 52 therethrough. Although the LPF 92 preferably includes an LR filter or an LC filter, it may also include a single conducting wire capable of applying sufficient reactance to the radio frequency (60 MHz) from the first radio frequency power supply 52. Meanwhile, electrically connected to the susceptor 16 serving as a lower electrode is a high pass filter (HPF) 94 for passing the radio frequency (60 MHz) from the first radio frequency power supply 52 to the ground.

Figure 3:
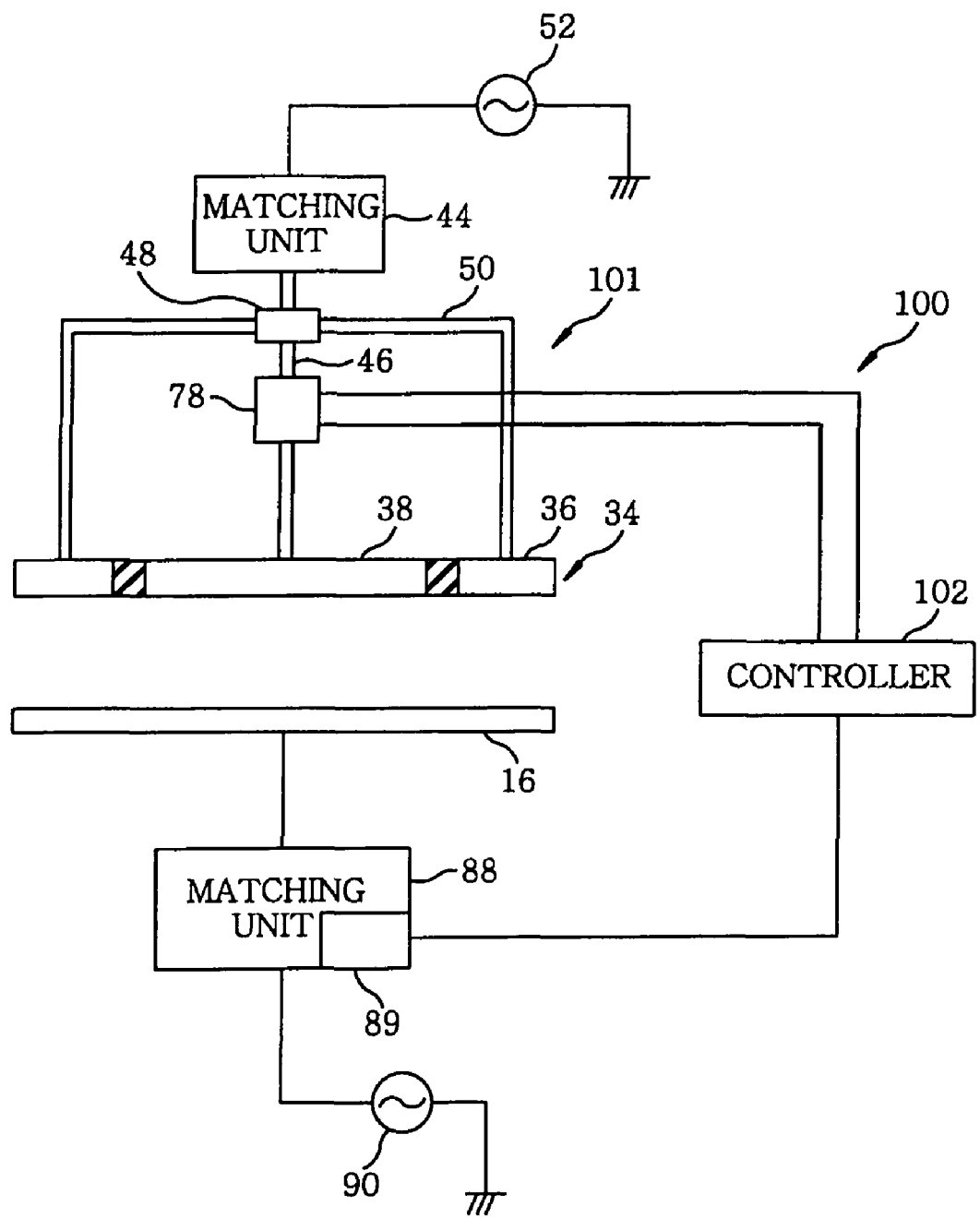
FIG. 3 provides a schematic diagram illustrating an impedance adjusting mechanism of the plasma etching apparatus in accordance with the preferred embodiment of the present invention.

As shown in FIG. 3, the plasma etching apparatus in accordance with this embodiment has an impedance adjusting mechanism 100. The impedance adjusting mechanism 100 includes the variable capacitor 78 forming a variable impedance unit; a resonance circuit 101 formed with a current flowing into the inner upper electrode 38; the Vpp monitor 89; and a controller 102 for searching a resonance point of the resonance circuit 101 based on a bias Vpp of the lower electrode (susceptor 16), that is detected by the Vpp monitor 89, while varying a capacitance of the variable capacitor 78 in a state where the plasma is generated in the apparatus and then setting the capacitance value of the variable capacitor at the resonance point as a reference value. Accordingly, it is possible to adjust the impedance on the side of the plasma source.

Moreover, the bias Vpp of the lower electrode, that is detected by the Vpp monitor 89, can also be said as a bias Vpp for a radio frequency power from the second radio frequency power supply 90, that is detected by the Vpp monitor 89.

The following is a description on an etching process performed by using a thus configured plasma etching apparatus. First of all, the gate valve 86 is kept closed after a semiconductor wafer W as an etching object is loaded into the chamber 10 through the gate 85 and then mounted on the susceptor 16. Next, an etching gas is introduced from the processing gas supply source 66 into the central and the peripheral gas introduction chamber 62 and 64 at a predetermined flow rate and flow rate ratio. Thereafter, by exhausting the inside of the chamber 10 with the gas exhaust unit 84 to set the inner pressure thereof to a specified level in the range of 0.1 Pa to 150 Pa, for example. Herein, as for a processing gas, various conventional processing gases can be employed. For example, a gas containing halogen elements such as a fluorocarbon gas (CxFy) may be properly used and other gases such as Ar gas, $O_2$ gas or the like may also be added thereto.

In a state where the etching gas is introduced into the chamber 10, a radio frequency power of 60 MHz for generating a plasma is applied from the first radio frequency power supply 52 to the upper electrode 34 with a specified power, whereas a radio frequency power of 2 MHz for attracting ions is applied from the second radio frequency power supply 90 to the susceptor 16 serving as a lower electrode with a specified power. Furthermore, by applying a DC voltage from the DC power supply 22 to the electrode 20 of the electrostatic chuck 18, the semiconductor wafer W is fixed on the susceptor 16.

The etching gas discharged through the gas discharge openings 56a of the inner upper electrode 38 is plasmarized by a glow discharge that is generated between the upper electrode 34 and the susceptor 16 serving as the lower electrode due to the radio frequency power. A surface to be processed in the semiconductor wafer W is etched by radicals and/or ions generated from such plasma.

In such plasma etching apparatus, since a radio frequency power of a radio frequency range (above 5 MHz to 10 MHz where ions are immovable) is supplied to the upper electrode 34, it is possible to form a high density plasma in a desirable dissociation state. Accordingly, the high density plasma can also be formed under a lower pressure condition.

Moreover, in the upper electrode 34, the inner upper electrode 38 directly facing the semiconductor wafer W serves also as a shower head and a flow rate ratio of a gas to be discharged to the central and pheripheral shower head can also be arbitrarily controlled.

Thus, a spatial density distribution of gas molecules or radicals can be controlled in a diametrical direction and, further, spatial distribution characteristics of an etching by radicals can also be arbitrarily controlled.

In the meantime, in the upper electrode 34, as will be described later, the outer and the inner upper electrode 36 and 38 are used as a primary and a secondary radio frequency electrode for generating a plasma, respectively. With the electrodes 36 and 38, a ratio of an electric field strength applied to electrons below those electrodes can be adjusted. Accordingly, a spatial distribution of a plasma density can be controlled in the diametrical direction and, further, spatial characteristics of a reactive ion etching can also be arbitrarily and precisely controlled.

Herein, the control of the plasma density spatial distribution, that is performed by varying an electric field strength or an input power ratio between the outer and the inner upper electrode 36 and 38, does not substantially affect the control of the radical density spatial distribution, that is performed by varying a flow rate of a processing gas, a gas density or a gas mixing ratio between the central and peripheral shower head. In other words, a dissociation of the processing gas discharged through the central and the peripheral shower head is carried out in an area under the inner upper electrode 38 and, further, the central and the peripheral shower head are provided in the inner upper electrode 38 and also in the same area. Thus, even if a balance of the electric field strength between the inner and the outer upper electrode 38 and 36 changes, a balance of the produced radical amount or the radical density therebetween is hardly affected. Accordingly, it is practically possible to independently control the spatial distribution of the plasma density and that of the radical density.

In addition, in the plasma etching apparatus of this embodiment, most or one-half of the plasma is generated right under the outer upper electrode 36 serving as a primary electrode and then diffused to portions right under the inner upper electrode 38. Therefore, in the inner upper electrode 38 serving as a shower head, an attack from plasma ions is small and, accordingly, sputtering process in the gas discharge openings 56a of the consumable electrode plate 56 can be effectively suppressed, resulting in a considerably increased lifespan of the electrode plate 56. Meanwhile, since the outer upper electrode 36 where most or one-half of the plasma is generated does not have gas discharge openings where an electric field is concentrated, the ion attack is small and, thus, the lifespan thereof is not shortened.

Figure 4:
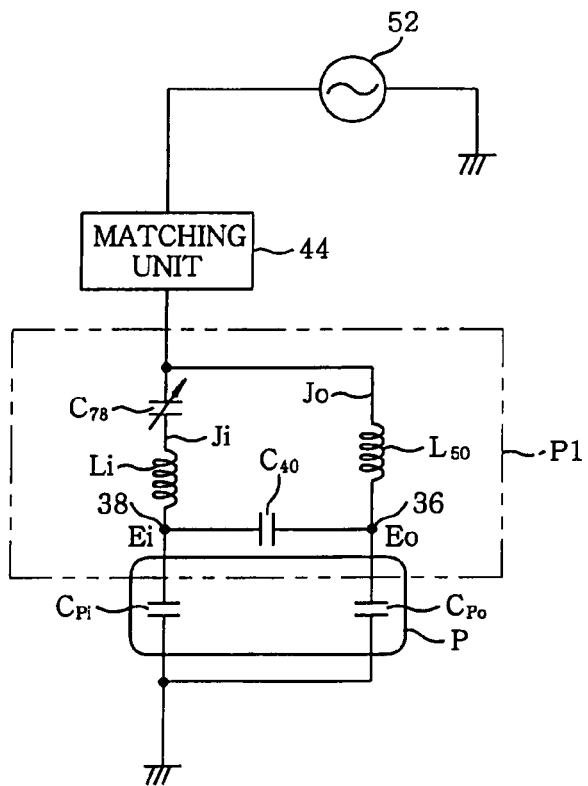
FIG. 4 presents a circuit diagram depicting an equivalent circuit of principal parts of a plasma generating unit in the plasma etching apparatus of FIG. 1.

Hereinafter, referring to FIGS. 2 and 4, the control of the plasma density spatial distribution, that is performed by varying relative electric field strengths or input powers between the outer and the inner upper electrode 36 and 38, will de described in detail. As described above, FIG. 2 shows a constitution of principal parts of the plasma etching apparatus of this embodiment, especially, that of principal parts forming a plasma generating unit, and FIG. 4 presents an equivalent circuit of the principal parts of the plasma generating unit. Furthermore, in FIGS. 2 and 4, a structure of a shower head unit and a resistance of each unit are omitted, respectively.

As described above, in a load circuit viewed from the connector 48, a coaxial cable path using the outer upper electrode 36 and the cylindrical power feeder 50 as a waveguide Jo is formed by the outer upper electrode 36, the cylindrical power feeder 50 and the cylindrical grounding conductor 10a. Herein, if a radius (an outer diameter) of the cylindrical power feeder 50 and a radius of the cylindrical grounding conductor 10a are respectively defined as ao and b, a characteristic impedance or inductance Lo of the coaxial cable path can be obtained by a following Eq. 1:

$$Lo = K \cdot \ln(b/ao) \qquad \text{Eq. 1}$$

wherein K is an integer determined by a carrier mobility and a dielectric constant of the waveguide.

Meanwhile, in the load circuit viewed from the connector 48, a coaxial cable path using a lower power feed rod 76 as a waveguide Ji is formed between the lower power feed rod 76 and the cylindrical grounding conductor 10a. Although the inner upper electrode 38 is provided on an extending line from the lower power feed rod 76, the diameters thereof are so extremely different and, thus, the impedance of the lower power feed rod 76 becomes dominant. Herein, if a radius (outer diameter) of the lower power feed 76 is defined as ai, a characteristic impedance or inductance Li of the coaxial cable path can be obtained by the following Eq. 2.

$$Li = K \cdot \ln(b/ai) \qquad \text{Eq. 2}$$

As can be seen from Eqs. 1 and 2, the inner waveguide Ji for transmitting a radio frequency power to the inner upper electrode 38 applies the same inductance as that of the conventional general radio frequency system, whereas the outer waveguide Jo for transmitting a radio frequency to the outer upper electrode 36 applies a considerably small inductance Lo due to a very large diameter thereof. Accordingly, in the load circuit viewed from the connector 48, a radio frequency can be easily transmitted through the outer waveguide Jo of a low impedance (small voltage drop) and, further, a strong electric field strength Eo can be obtained on the bottom surface (plasma contact surface) of the outer upper electrode 36 by supplying a comparatively large radio frequency power Po to the outer upper electrode 36. On the other hand, the radio frequency power is difficult to be transmitted through the inner waveguide Ji of a high impedance (large voltage drop) and also an electric field strength Ei obtained on a bottom surface (plasma contact surface) of the inner upper electrode 38 can be smaller than the electric field strength Eo of the outer upper electrode 36 since a radio frequency power Pi supplied to the inner upper electrode 38 is smaller than the radio frequency power Po supplied to the outer upper electrode 36.

In the upper electrode 34, electrons are accelerated by the relatively strong electric field strength Eo right under the outer upper electrode 36 and by the relatively weak electric field strength Ei right under the inner upper electrode 38. Accordingly, most or one-half of the plasma P is generated right under the outer upper electrode 36, and a part of the plasma P is supplementarily generated right under the inner upper electrode 38. Moreover, the high density plasma generated right under the outer upper electrode 36 is diffused inwardly and outwardly in the diametrical direction, so that the plasma density becomes uniform in the diametrical direction in the plasma processing space between the upper electrode 34 and the susceptor 16.

In the coaxial cable path formed by the outer upper electrode 36, the cylindrical power feeder 50 and the cylindrical grounding conductor 10a, a maximum transmission power $P_{max}$ depends on the radius ao of the cylindrical power feeder 50 and the radius b of the cylindrical grounding conductor 10a and is given by the following Eq. 3:

$$P_{max}/Eo_{max}^2 = ao^2[\ln(b/ao)]^2/2Zo \qquad \text{Eq. 3}$$

where, Zo indicates an input impedance of the coaxial cable path viewed from the matching unit 44, and $Eo_{max}^2$ represents a maximum electric field strength of an RF transmission system.

In Eq. 3, the maximum transmission power $P_{max}$ becomes maximum when a ratio of b/ao is approximately 1.65. Therefore, in order to improve a power transmission efficiency of the outer waveguide Jo, the ratio of the radius b of the cylindrical grounding conductor 10a to the radius ao of the cylindrical power feeder 50 is preferable to be 1.65. Furthermore, the preferable ratio of b to ao ranges at least from 1.2 to 2.0 and, more preferably, from 1.5 to 1.7.

Figure 5:
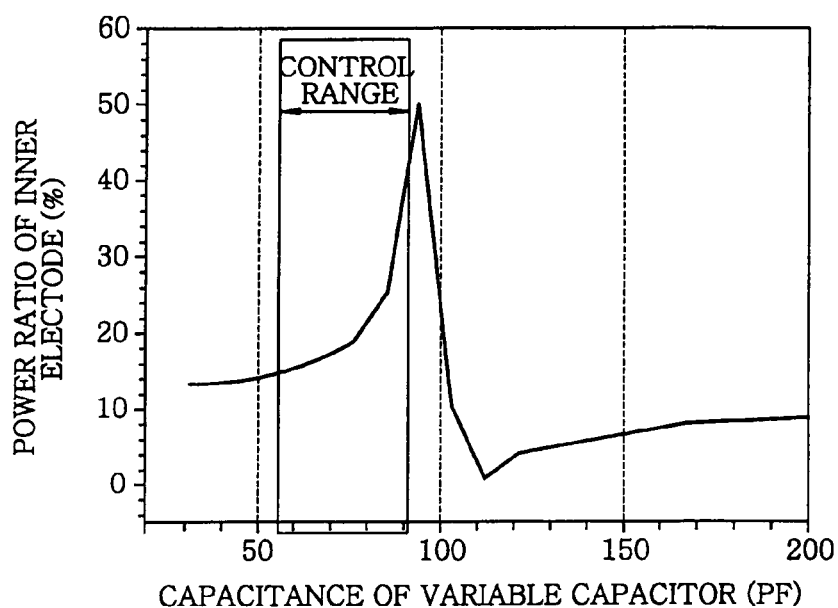
FIG. 5 describes a relationship between a capacitance of a variable capacitor and an electric field strength ratio in the plasma etching apparatus of FIG. 1.

In order to arbitrarily or precisely control the spatial distribution of the plasma density, it is preferable to adjust the balance, i.e., the ratio of the outer electric field Eo right under the outer upper electrode 36 (or an input power Po applied to the outer upper electrode 36) to the inner electric field Ei right under the inner upper electrode 38 (or an input power Pi applied to the inner upper electrode 38). As an adjusting device thereof, the variable capacitor 78 is inserted in the middle of the lower power feed rod 76. FIG. 5 illustrates a relationship between a capacitance $C_{78}$ of the variable capacitor 78 and the ratio of the input power Pi applied to the inner upper electrode 38 to an entire input power. As can be seen clearly from FIG. 5, by varying the capacitance $C_{78}$ of the variable capacitor 78, an impedance or reactance of the inner waveguide Ji can be either increased or decreased. Accordingly, it is possible to change a relative ratio of the voltage drop of the outer waveguide Jo to that of the inner waveguide Ji and further adjust a ratio of the outer electric field strength Eo (outer input power Po) to the inner electric field strength Ei (inner input power Pi).

An impedance of an ion sheath for causing a plasma potential drop is generally capacitive. In the equivalent circuit of FIG. 4, capacitances of sheath impedances right under the outer upper electrode 36 and the inner upper electrode 38 are represented by $C_{po}$ and $C_{pi}$, respectively. Furthermore, a capacitance $C_{40}$ of a capacitor formed between the outer and the inner upper electrode 36 and 38 controls a balance of the outer electric field strength Eo (outer input power Po) and the inner electric field strength Ei (inner input power Pi) together with a capacitance $C_{78}$ of the variable capacitor 78. Thus, the capacitance $C_{40}$ is preferably set or adjusted to a value capable of optimizing a balance adjusting function of an electric field (input power) by the variable capacitor 78.

However, in such a plasma processing apparatus, there gives rise to a minor difference in the impedance on the side of the plasma source between apparatuses or cleaning cycles due to dimensional tolerances or attachment errors of parts, thereby affecting process characteristics.

Accordingly, in this embodiment, in a state where plasma is generated, a preliminary impedance adjustment is performed by the impedance adjusting mechanism 100 including the aforementioned variable capacitor 78 as a variable impedance unit for adjusting a ratio of the outer electric field strength Eo (outer input power Po) and the inner electric field strength Ei (inner input power Pi). The impedance adjusting mechanism 100 uses an impedance varying function of the variable capacitor 78 and the resonance circuit 101 formed by a current flowing into the inner upper electrode 38 of the upper electrode 34. Furthermore, the impedance adjusting mechanism 100 searches a resonance point of the resonance circuit by using the Vpp monitor 89 and then sets a value of the variable impedance unit at the resonance point, i.e., the capacitance value of the variable capacitor 78, as a reference value.

To be specific, when the plasma is generated in the apparatus, a bias Vpp of the lower electrode is detected by the Vpp monitor 89 while varying the capacitance of the variable capacitor 78. Then, based on the bias Vpp of the lower electrode, the controller 102 searches a resonance point of the resonance circuit 101 formed by the current flowing into the inner upper electrode 38. Next, a capacitance value of the variable capacitor 78 at the resonance point is set as a reference value, thereby making it possible to adjust the impedance from the plasma source. Herein, the impedance on the side of the plasma source in this embodiment represents an impedance of a circuit provided within the range indicated by PI in FIG. 4.

Figure 6A:
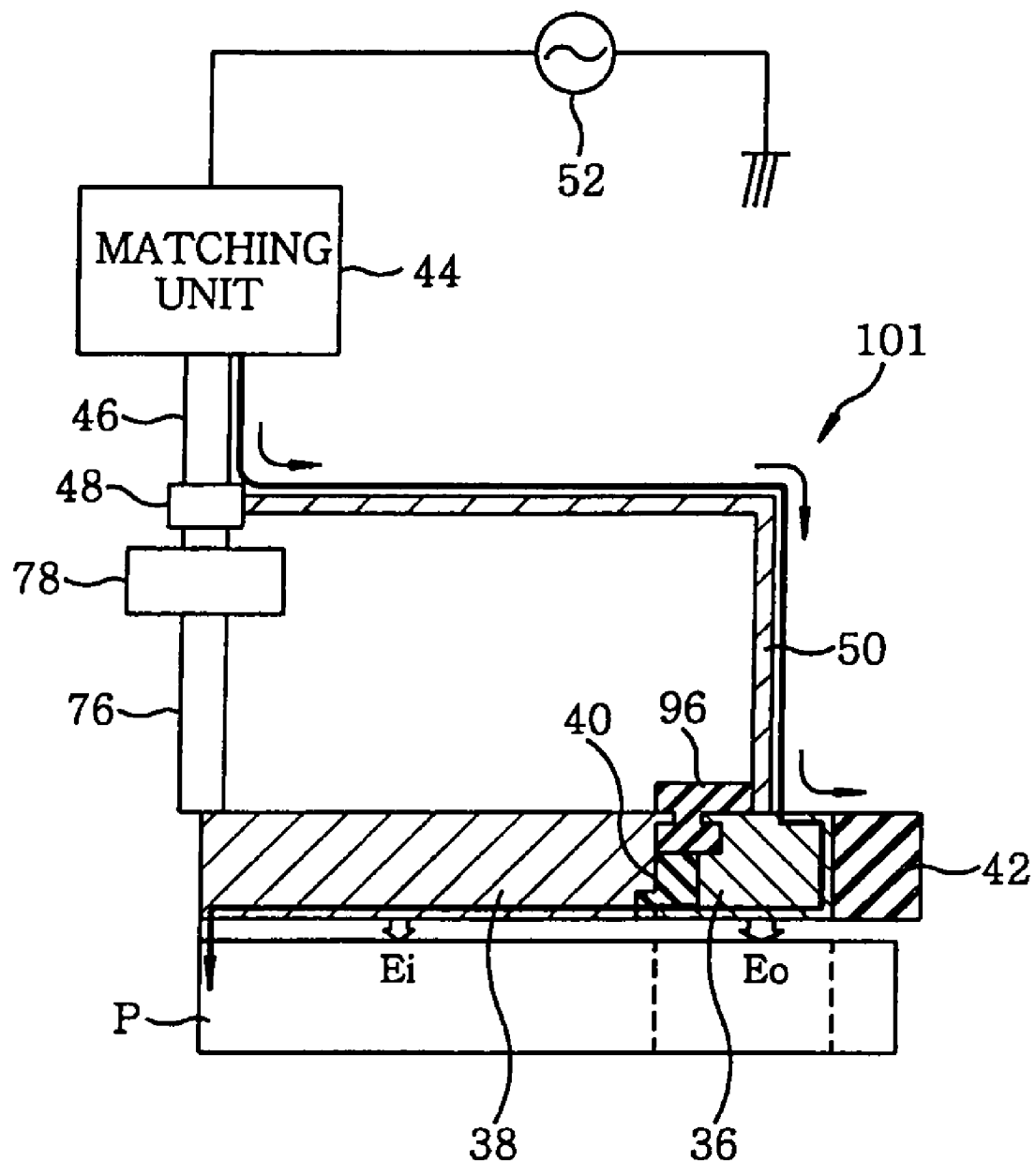
FIG. 6 offers a detailed diagram of a resonance circuit of the impedance adjusting mechanism in the plasma etching apparatus of FIG. 1.
Figure 6B:
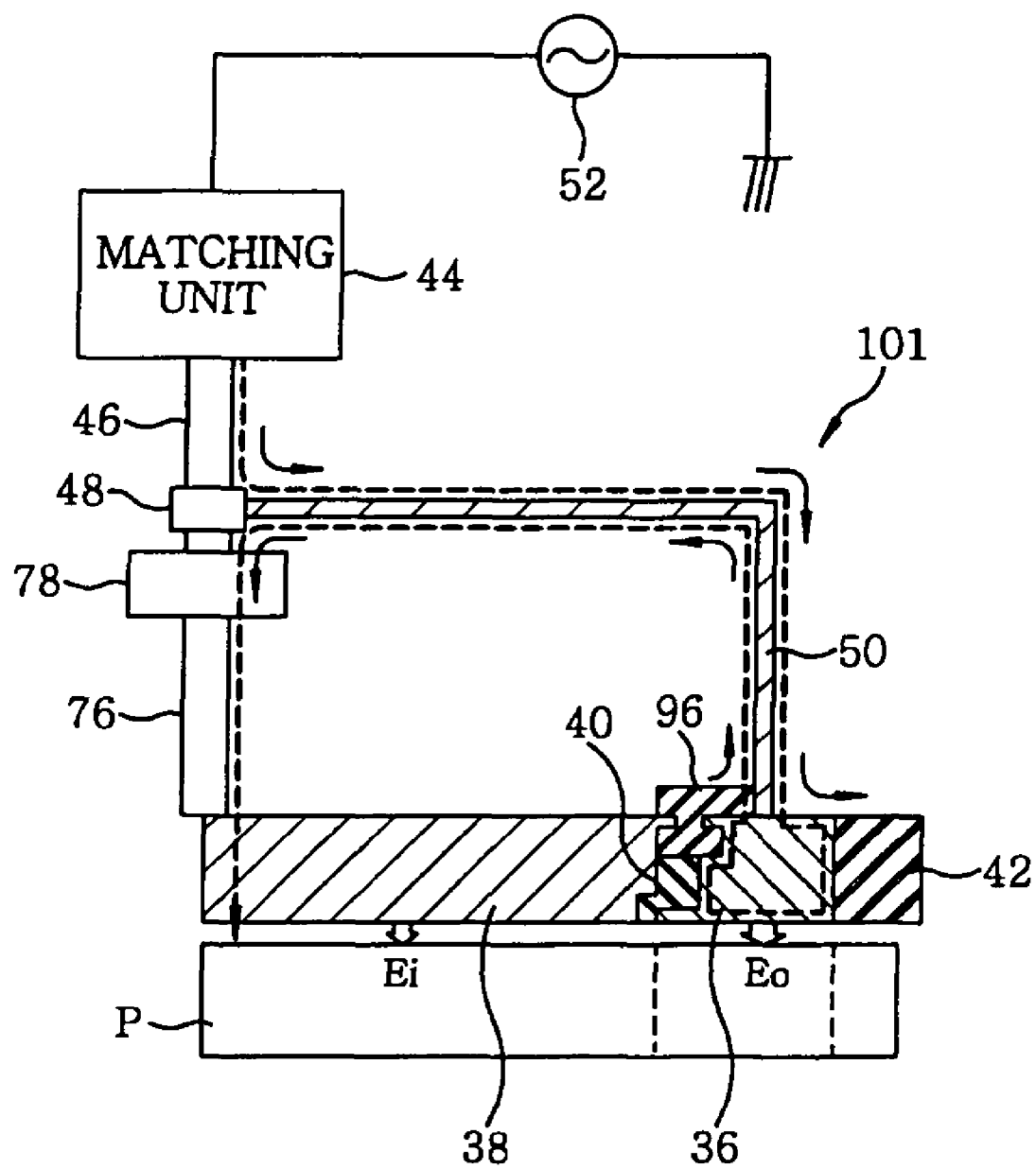

FIGS. 6A and 6B provide a detailed description on the resonance circuit 101. The resonance circuit 101 is formed by a solid line of FIG. 6A extending from the power feed rod 46 to the inner upper electrode 38 via the connector 48, the cylindrical power feeder 50 for feeding power to the outer upper electrode and the outer upper electrode 36, and by a dashed line of FIG. 6B extending from the power feed rod 46 to the inner upper electrode 38 via the connector 48, the cylindrical power feeder 50 for feeding power to the outer upper electrode 36, the outer upper electrode 36, the cylindrical power feeder 50 and the variable capacitor 78.

In the resonance circuit configured as such, the largest radio frequency current flows in the inner upper electrode 38 at the resonance point. Furthermore, as shown in FIGS. 6A and 6B, the radio frequency current flows on the surface of a conductor.

As depicted in the aforementioned FIG. 5, by varying the capacitance of the variable capacitor 78, it is possible to change a rate of the inner electric field strength Ei from the inner upper electrode 38. That is, if the capacitance of the variable capacitor 78 is changed, a resonance point of the resonance circuit 101 can be searched.

Figure 7:
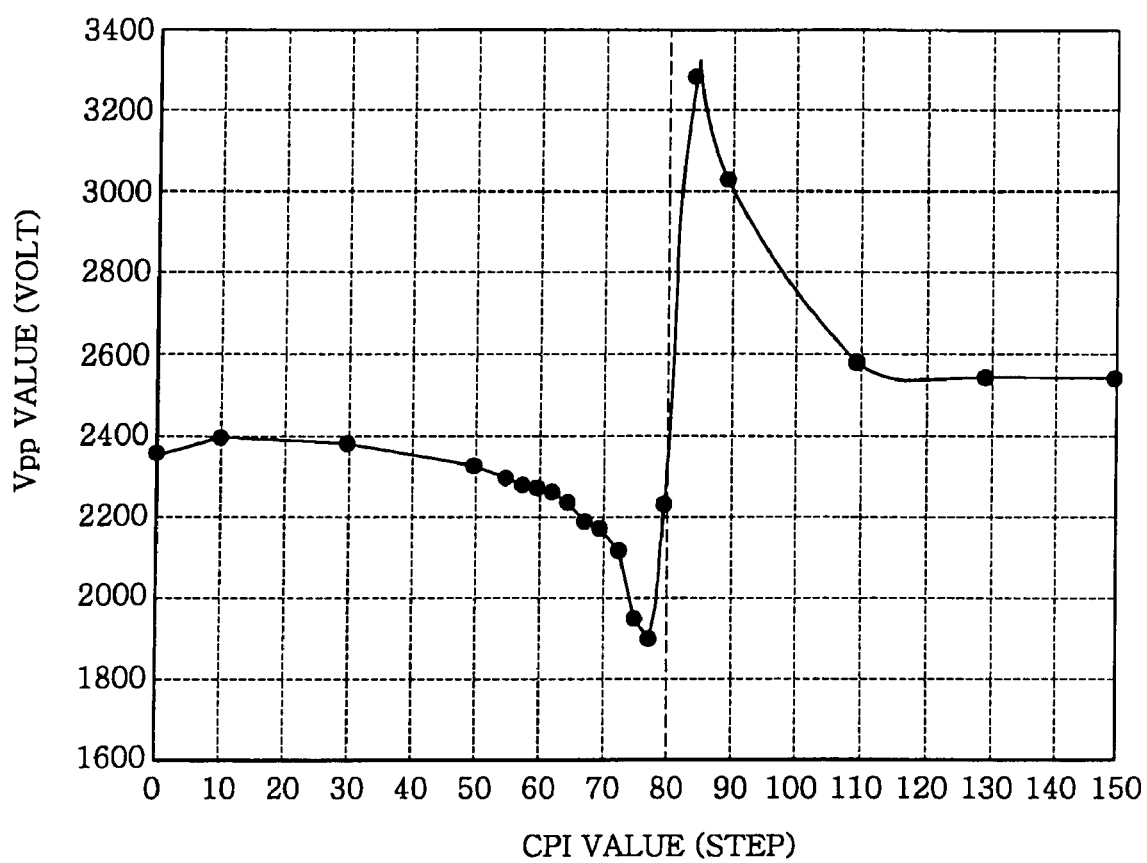
FIG. 7 describes a relationship between a CPI value of a variable capacitor of the impedance adjusting mechanism and a bias Vpp of a lower electrode in the plasma etching apparatus of FIG. 1.

A radio frequency current flowing in the inner upper electrode 38 affects the state of the apparatus, e.g., the bias Vpp of the susceptor 16 functioning as a lower electrode. Further, the Vpp value becomes minimum at a resonance point where a largest radio frequency power flows in the inner upper electrode. In other words, as illustrated in FIG. 7, if a step (CPI value) of the variable capacitor 78 increases/decreases to vary the capacitance in a state where a plasma is generated, the bias Vpp of the lower electrode, that is detected by the Vpp monitor 89, changes, and the Vpp value becomes minimum at a specific CPI value. When Vpp value is the minimum, the resonance circuit exhibits a resonance point. Furthermore, the CPI value represents a value obtained by dividing a variation range of the capacitance of the variable capacitor 78 into a specific number of steps, that corresponds to an actual capacitance value.

Figure 8:
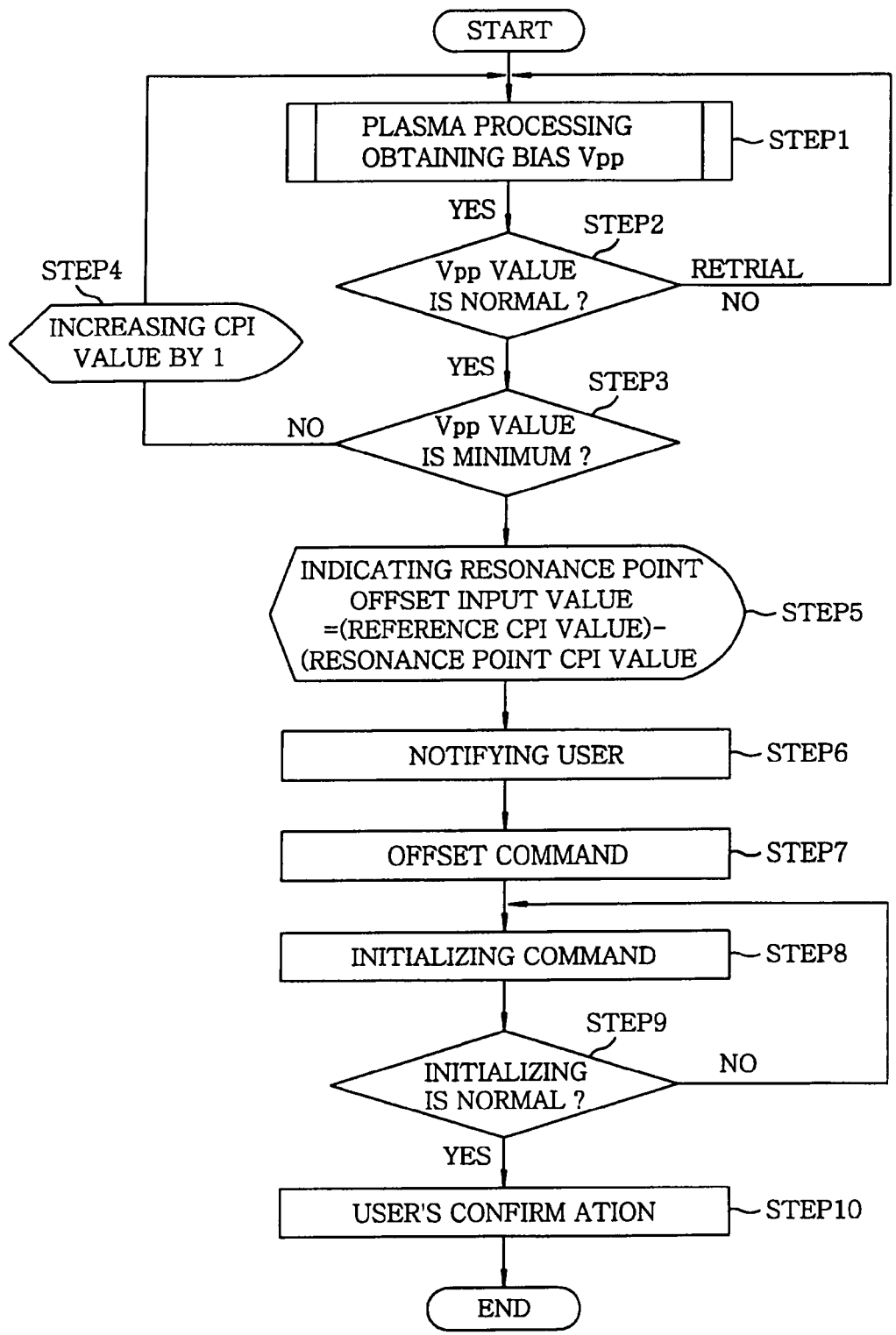
FIG. 8 is a flowchart for explaining an impedance adjusting process of the impedance adjusting mechanism in the plasma etching apparatus of FIG. 1.

In this embodiment, by using the controller 102 of the impedance adjusting mechanism 100, an impedance adjustment is carried out. The sequence thereof will be described in detail with reference to a flowchart of FIG. 8.

First of all, a dummy wafer is loaded into a plasma etching apparatus and then, power is supplied from the first radio frequency power supply 52, thereby generating a plasma. Also a bias Vpp of the lower electrode (susceptor 16) is obtained in an initial step (CPI value) of the variable capacitor 78 (STEP 1), wherein the Vpp is obtained from an average value of a plurality of, e.g., twenty, data. In this case, it is checked whether or not the Vpp is an abnormal value due to plasma instability or an abnormal discharge (STEP 2). To be specific, in case an amplitude of the plurality of Vpp data is greater than or equal to, e.g., 50 V, there is possibility of the plasma instability, the abnormal discharge or the like, that requires the process to return to STEP 1.

STEP 2 is carried out by monitoring a variation of the Vpp as follows.

The first three points among the plurality of Vpp data are compared as follows:

$$-50 < Vpp(i+1) - Vpp(i) < 50 \ (i=0, 1, 2)$$

The remaining Vpp data from a fourth point on are compared by a moving average, as described as follows:

$$-50 < Vpp(i) - (Vpp(i-1) + Vpp(i-2) + Vpp(i-3))/3 < 50$$
$$(3 < I < 19)$$

In case each of the Vpp values is normal, the controller 102 determines whether or not the average Vpp value is minimum (STEP 3) as follows. In other words, from FIG. 7, Vpp(j+1)−Vpp(j) is calculated (where, j and Vpp(j) indicate a CPI value and an average Vpp value at the CPI value j, respectively).

Then, in case of Vpp(j+1)−Vpp(j)<0, it is determined that Vpp(j) is not minimum.

On the other hand, in case of Vpp(j+1)−Vpp(j)>0, it is determined that Vpp(j) is minimum.

Further, in case of employing the above-described method for determining whether or not the average Vpp value is minimum, the CPI value (initial CPI value) when the STEPs 1 to 3 are carried out initially needs to be set to be smaller than a CPI value obtained near the resonance point.

If the average Vpp value is not minimum, the CPI value increases by one (STEP 4) and, then, the aforementioned STEPs 1 to 3 are performed again. Also, if a resonance point is not searched even until the CPI value is increased up to ten or above by repeating the above process, there is a possibility that the CPI value may have passed the resonance point. In that case, the CPI value is repetitively decreased by one, while searching a point where the Vpp value becomes minimum.

Figure 9:
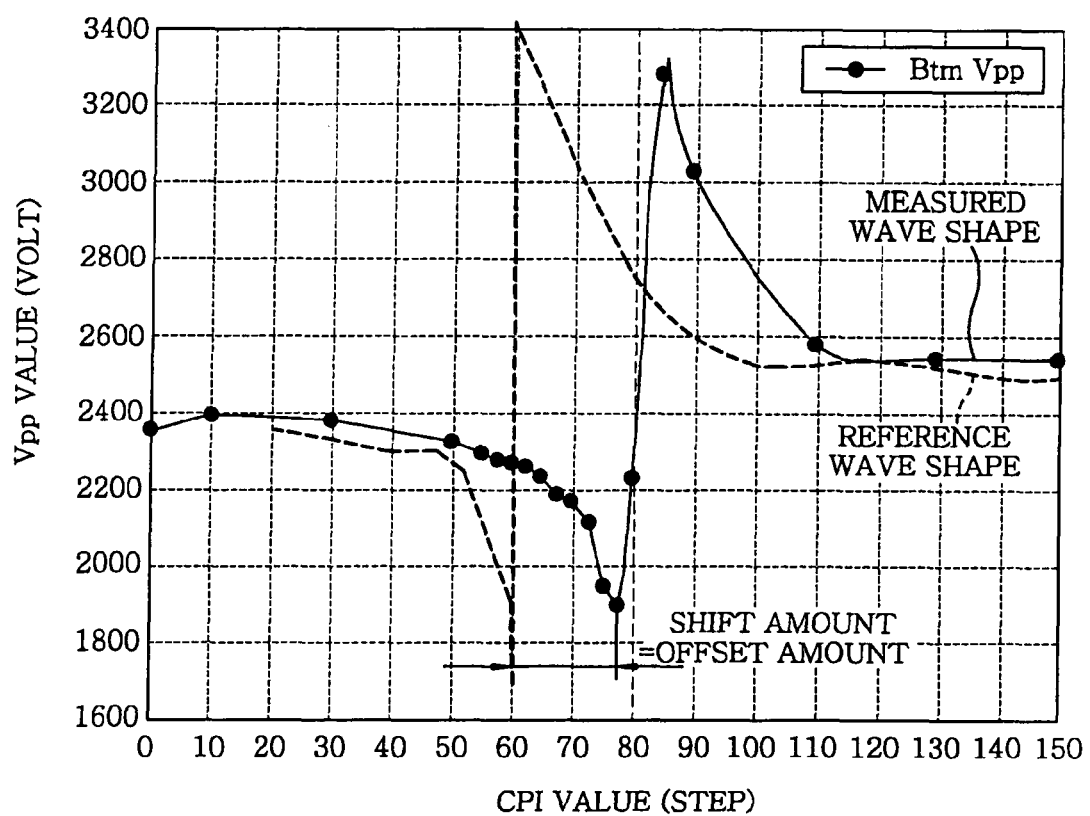
FIG. 9 illustrates a reference waveform and a measured waveform representing a relationship between the CPI value of the variable capacitor of the impedance adjusting mechanism and the bias Vpp of the lower electrode in the plasma etching apparatus of FIG. 1.

Meanwhile, if the obtained Vpp value is minimum, the CPI value is set as the resonance point and, then, a difference between the CPI value of the resonance point and a reference CPI value is calculated as an offset amount (STEP 5). In other words, the offset amount is obtained by subtracting a CPI value of a current resonance point from the reference CPI value. Herein, the reference CPI value indicates a CPI value at the resonance point of the resonance circuit 101, that is obtained before a cleaning process is performed, or a value at a resonance point of the resonance circuit 101 of another apparatus whose impedance is adjusted while having the same structure. Furthermore, the resonance point is set as a parameter in the controller 102. As illustrated in FIG. 9, the offset amount corresponds to a deviation of the Vpp from the reference waveform (in case a CPI in a resonance point is a reference value). In this way, by recognizing the deviation of the CPI value at the resonance point, it is possible to recognize a deviation of the impedance value from the reference value.

The offset amount is displayed on, e.g., a device screen, so that a user can check the calculated offset value on the screen (STEP 6). Next, an offset instruction is executed by the user's manipulation (STEP 7). Accordingly, the instruction is transmitted from the controller 102 to a controller box (not shown) of the variable capacitor 78. As a result, the controller box of the variable capacitor 78 is initialized and, further, the CPI value of the resonance point of the variable capacitor 78 is offset by as much as the aforementioned offset value (STEP 8). Thereafter, it is checked whether or not the initializing instruction has been normally performed (STEP 9). If it is determined that the instruction has been normally performed, the aforementioned STEPs 1 to 3 are carried out and then, the user checks whether or not the resonance point has been corrected (STEP 10). If it has been corrected, the impedance adjustment is completed. On the other hand, if it has not been corrected, the impedance adjustment is performed again.

Likewise, since the capacitance value of the variable capacitor 78 can be adjusted to a reference value by using the resonance point of the resonance circuit 101, it is possible to minimize an impedance difference on the side of the plasma source, which is generated between apparatuses or cleaning cycles due to dimensional tolerances or attachment errors of the parts. Furthermore, the adjustment can be performed in a state where plasma is generated and therefore, a high accuracy of impedance adjusting can be achieved. Furthermore, since neither special measuring device nor test device is used, it is advantageous in terms of a cost. Moreover, the adjustment can be automatically carried out, so that an artificial mistake is hardly made. Although the aforementioned impedance adjusting process is performed by loading a dummy wafer into the plasma etching apparatus, the impedance adjustment can be performed in the same manner without loading the dummy wafer.

Figure 10:
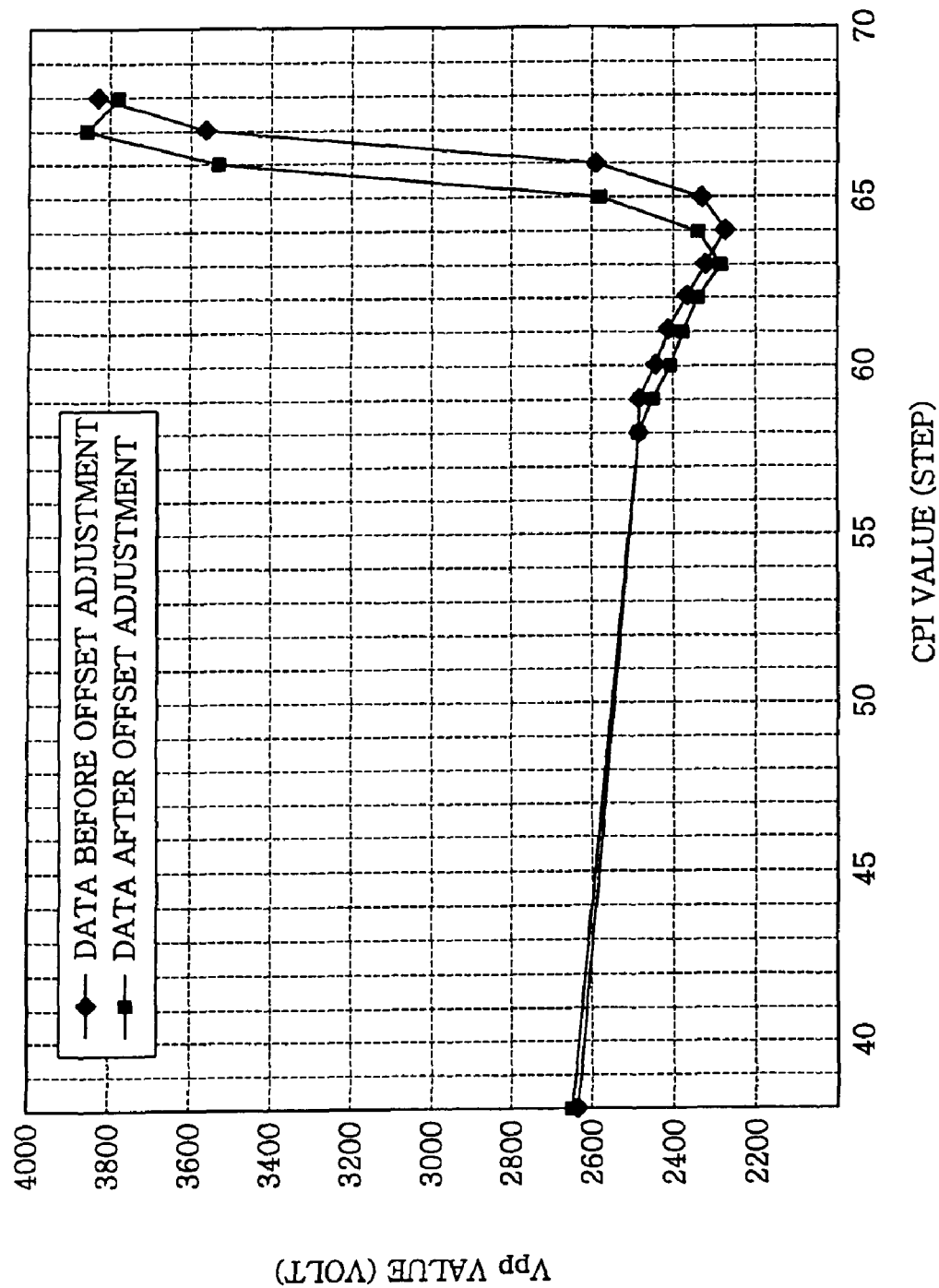
FIG. 10 presents a relationship between a CPI value of the variable capacitor and a bias Vpp of the lower electrode, which is obtained by actually performing an impedance adjustment.

FIG. 10 presents an exemplary impedance adjustment performed as described above. In this example, a CPI value at a reference resonance point was 63, and a CPI value at a resonance point obtained before being adjusted was 64. Accordingly, the CPI value at the resonance point was adjusted to 63 in accordance with the aforementioned process.

Figure 11:
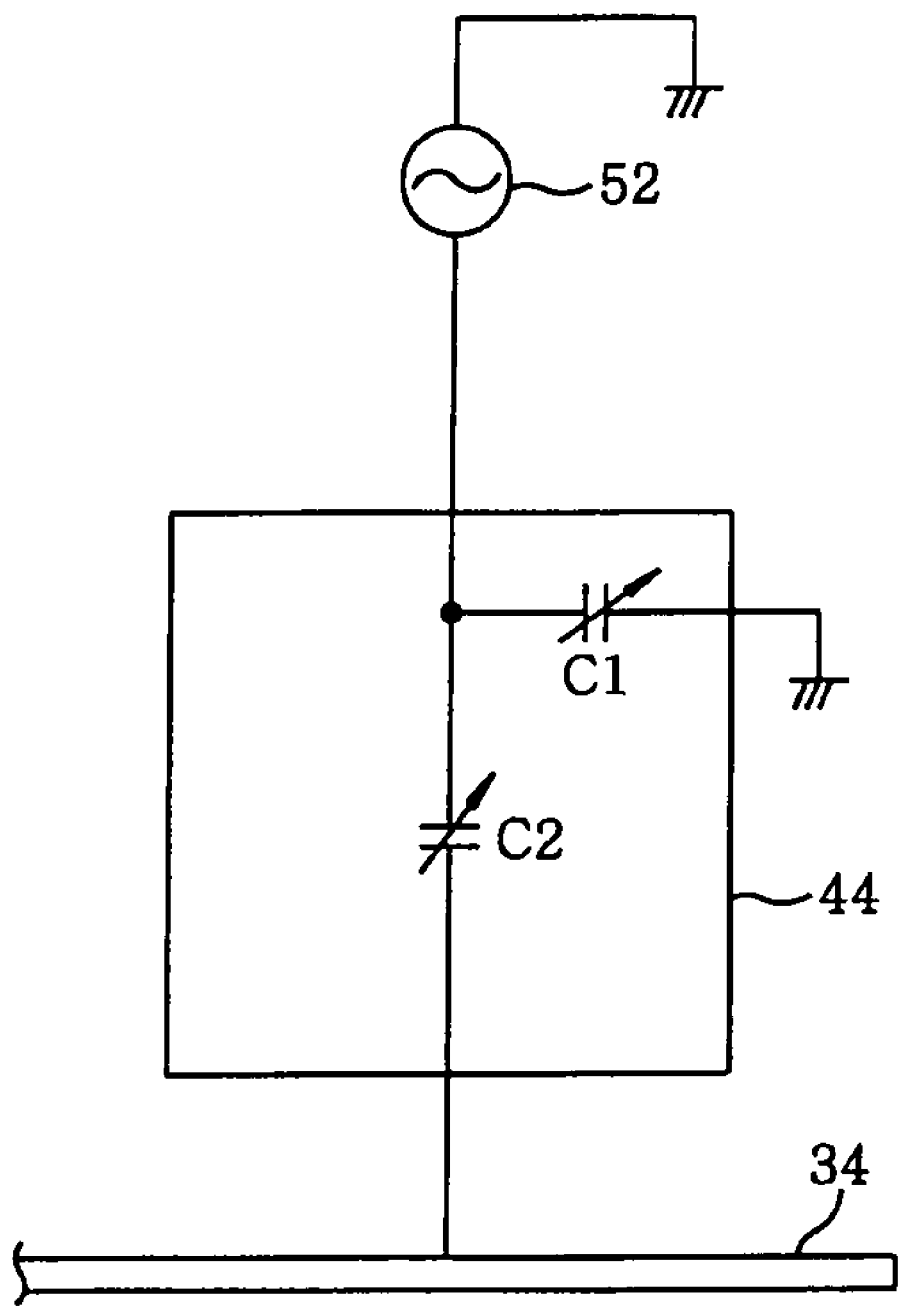
FIG. 11 depicts a schematic constitution of a matching unit connected to a first radio frequency power supply in the plasma etching apparatus of FIG. 1.
Figure 12:
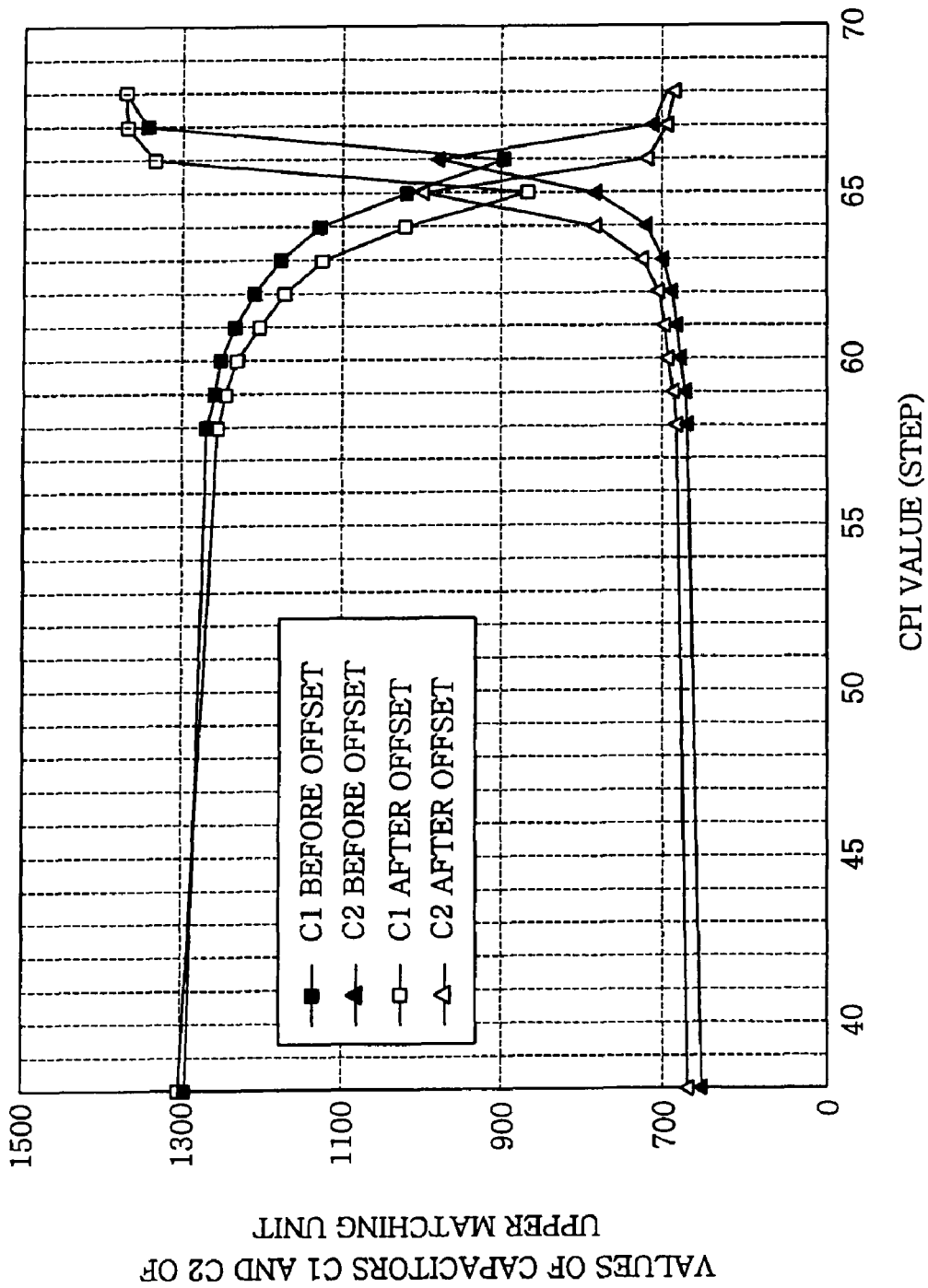
FIG. 12 shows a relationship between a CPI value of the variable capacitor and a value of a capacitor of a matching unit, which is obtained by employing the capacitor of the matching unit connected to the first radio frequency power supply in an apparatus state.

In the aforementioned example, the resonance point of the resonance circuit 101 is searched by using the bias Vpp in the lower electrode. However, it is also possible to search the resonance point by using capacitances of two capacitors C1 and C2 of the matching unit 44 of the upper electrode illustrated in FIG. 11. FIG. 12 depicts a result obtained by searching the resonance point and then performing the actual impedance adjustment. Herein, C1 and C2 indicate a minimum and a maximum value at the resonance point, respectively. In this example, the reference CPI value was 65 and the CPI value before being adjusted is 66. In this case as well, the CPI value at the minimum value of C1 and the maximum value of C2 are adjusted to 65 in accordance with the aforementioned process, thereby making it possible to perform the impedance adjustment.

In addition, in case VI probes (detector capable of detecting a current, a voltage, a phase, frequency or the like) are installed at the upper and the lower electrode, respectively, the resonance point of the resonance circuit 101 can be searched even by using the voltage value or the current value.

Also, the present invention is not limited to the aforementioned embodiment and various modifications thereof may be made. For example, in the aforementioned embodiment, a variable capacitor is used as a variable impedance unit. However, another circuit such as a variable coil, a variable resistance or the like can also be used. Besides, although a variable impedance unit is installed on a power feed line of the inner upper electrode in this embodiment, it can also be installed on a power feed line of the outer upper electrode. In addition, although there has been described a plasma processing apparatus in which a radio frequency power for generating a plasma is applied to the upper electrode, it is also possible to use a plasma processing apparatus in which a radio frequency power is applied to the lower electrode. Moreover, a bias Vpp of the lower electrode, a capacitance of a capacitor included in the matching unit of the upper electrode and a voltage or a current value detected by the VI probe have been exemplified in a case where the electrode to which a radio frequency power for generating a plasma is divided into two electrodes. However, the present invention is not limited thereto and can be extended to any case as long as a resonance point of the resonance circuit can be searched. Although this embodiment has described the plasma etching apparatus as an example, the present invention may be applied to other plasma processing apparatuses such as a CVD film forming apparatus, a sputtering apparatus and the like.

While the invention has been shown and described with respect to the preferred embodiments, it will be understood by those skilled in the art that various changes and modification may be made without departing from the spirit and scope of the invention as defined in the following claims.

What is claimed is:

1. An impedance adjustment method in a plasma processing apparatus including an evacuable processing chamber accommodating therein a substrate to be processed; a first and a second electrode installed to face each other in the processing chamber, the first electrode being divided into an inner and an outer electrode; and a radio frequency power supply unit for supplying a plasma forming radio frequency power to the first electrode; and a processing gas supply unit for supplying a processing gas into the processing chamber in order to perform a plasma processing on the substrate to be processed by generating a plasma of the processing gas between the first and the second electrode, the method comprising the steps of:

connecting a power feed rod to the inner electrode;

installing a cylindrical power feeder such that a lower portion thereof is connected to the outer electrode and an upper portion thereof is electrically connected to the radio frequency power supply unit;

installing a cylindrical grounding conductor upwardly extended from a sidewall of the processing chamber, wherein the outer electrode, the cylindrical power feeder and the cylindrical grounding conductor constitute an outer coaxial cable path using the outer electrode and the cylindrical power feeder as an outer waveguide and wherein the power feed rod and the cylindrical grounding conductor constitute an inner coaxial cable path using the power feed rod as an inner waveguide;

installing a variable capacitor on the power feed rod;

installing a detector for detecting an apparatus state to be used to search a point of a circuit where a largest radio frequency power flows in the inner electrode, the circuit allowing a radio frequency current to flow in the inner electrode of the first electrode;

searching the point of the circuit by detecting a signal of the apparatus state with the detector while varying a capacitance of the variable capacitor by changing a setting value thereof while the plasma is generated, thereby finding a specific setting value of the variable capacitor at the point, wherein the variable capacitor has a specified capacitance at the specific setting value; and adjusting the specific setting value of the variable capacitor at the point to a reference setting value, such that the variable capacitor has the specified capacitance at the reference setting value.

2. The impedance adjustment method of claim 1, wherein the reference setting value of the variable capacitor is a setting value of the variable capacitor at the point of the circuit where a largest radio frequency power flows in the inner electrode before cleaning, or a setting value of a variable capacitor adjusted in a same manner as in the steps of the impedance adjustment method in another apparatus having an identical structure to that of the plasma processing apparatus.

3. The impedance adjustment method of claim 1, wherein the circuit is formed by a line formed between the inner and the outer electrode via a capacitor, a line formed between the radio frequency power supply unit and the inner electrode via the variable capacitor, and a line formed between the radio frequency power supply unit and the outer electrode.

4. The impedance adjustment method of claim 1, wherein the detector for detecting the apparatus state is a voltage detector installed on the side of the second electrode.

5. The impedance adjustment method of claim 1, wherein the radio frequency power supply unit includes a radio frequency power supply and a matching unit for matching a load impedance to an internal or output impedance of the radio frequency power supply, and wherein the detector for detecting the apparatus state detects a capacitance of a capacitor of the matching unit.

6. The impedance adjustment method of claim 1, wherein the detector for detecting the apparatus state is a VI probe installed on the side of the first or the second electrode, for detecting a current or a voltage of a plasma.

7. The impedance adjustment method of claim 1, wherein a diameter of the outer waveguide is larger than a diameter of the inner waveguide thereby supplying a larger radio frequency power to the outer electrode than the inner electrode.

8. The impedance adjustment method of claim 1, wherein a ratio of a radius of the cylindrical grounding conductor to a radius of the cylindrical power feeder ranges from 1.2 to 2.0 to improve a power transmission efficiency of the outer waveguide.

* * * * *